United States Patent [19]
Imoto et al.

[11] Patent Number: 6,166,404
[45] Date of Patent: Dec. 26, 2000

[54] SEMICONDUCTOR DEVICE IN WHICH AT LEAST TWO FIELD EFFECT TRANSISTORS HAVING DIFFERENT THRESHOLD VOLTAGES ARE FORMED ON A COMMON BASE

[75] Inventors: Tsutomu Imoto; Shinichi Wada, both of Kanagawa, Japan

[73] Assignee: Sony Corporation, Tokyo, Japan

[21] Appl. No.: 09/467,879

[22] Filed: Dec. 21, 1999

[30] Foreign Application Priority Data

Dec. 28, 1998 [JP] Japan .................. 10-374572

[51] Int. Cl.[7] .......................... H01L 29/80; H01L 31/112; H01L 31/072; H01L 31/109; H01L 31/0328
[52] U.S. Cl. ..................... 257/279; 257/284; 257/192
[58] Field of Search ..................... 257/260, 270, 257/279, 280, 284, 192, 194, 195

[56] References Cited

U.S. PATENT DOCUMENTS 5,834,802 11/1998 Takahashi et al. .............. 257/280
5,869,856 2/1999 Kasahara ........................ 257/287

*Primary Examiner*—Ngân V. Ngô
*Attorney, Agent, or Firm*—Sonnenschein, Nath & Rosenthal

[57] ABSTRACT

A semiconductor device including field effect transistors having different threshold voltages formed on a common base, characterized by including: a first field effect transistor having a p-n junction gate; and a second field effect transistor having a Schottky junction gate; wherein a threshold voltage of the first field effect transistor is set on the basis of a depth of the p-n junction, and a threshold voltage of the second field effect transistor is set on the basis of selection of a barrier potential of the Schottky junction.

10 Claims, 5 Drawing Sheets

SEMICONDUCTOR DEVICE IN WHICH AT LEAST TWO FIELD EFFECT TRANSISTORS HAVING DIFFERENT THRESHOLD VOLTAGES ARE FORMED ON A COMMON BASE

BACKGROUND OF THE INVENTION

The present invention relates to a semiconductor device and a fabrication method thereof, and particularly to a semiconductor device in which at least two field effect transistors having different threshold voltages are formed on a common base, and a fabrication method thereof.

In moving object communication systems such as portable telephones, radio waves in a range from a microwaveband to a millimeter-waveband are utilized for transmission and receipt of audio and image data. At present, to amplify, switch and mix such high-frequency signals for transmission and receipt thereof, field effect transistors (FETs) such as Schottky metal-semiconductor field effect transistors (MESFETs) or junction field effect transistors (JFETS) formed on compound semiconductors are often used. In particular, modulation-doped FETs (MODFETs), which are advantageous in that gains can be ensured even for higher-frequency signals; the noise power of the device is low from the structural viewpoint; a high efficiency can be obtained in the case where the device is configured as a power amplifier; and the insertion loss can be lowered in the case where the device is configured as a switch, are extensively available for monolithic microwave integrated circuits (MMICs).

The MMIC using such a MODFET is expected to contain a logic circuit of a direct coupled FET logic (DCFL) type which is relatively low in power consumption. This logic circuit is required to form a decoder contained, for example, in a SPnT (n: integer) switch.

The DCFL circuit requires an enhancement FET (EFET); however, the above-described power amplifier is configured mainly by using a depletion FET (DFET). As a result, for the MMIC containing the above logic circuit, it is required to form a DFET and an EFET on the same base.

A method of forming a DFET and an EFET each of which is of the modulation-doped type on the same base is disclosed, for example, in U.S. Pat. No. 4,615,102. FIG. 5 shows a schematic sectional view of a semiconductor device which is formed in accordance with the method disclosed in the above document. Referring to FIG. 5, a channel layer 2 made from undoped GaAs, an electron supply layer 3 made from n-type AlGaAs, a threshold value control layer 4 made from n-type GaAs, a first etching stopping layer 5 made from n-type AlGaAs, a first ohmic contact layer 6 made from n-type GaAs, a second etching stopping layer 7 made from n-type AlGaAs, and a second ohmic contact layer 8 made from n-type GaAs are sequentially formed by epitaxial growth on a base 1 made from a semi-insulating GaAs, to form a stacked semiconductor layer. Then, a DFET formation area and an EFET formation area are isolated from each other, typically, by forming a trench therebetween in such a manner that the trench extends across the stacked semiconductor layer. A portion, present in the EFET formation area, of the second ohmic contact layer 8 is removed. Recesses 9R and 10R different in depth are formed in gate formation portions of the DFET and EFET formation areas, and Schottky gate electrodes 9 and 10 are formed in the recesses 9R and 10R, respectively. Source/Drain electrodes (hereinafter, referred to as "S/D electrodes") 11 and 12, and 13 and 14 are formed on both sides of the gate electrode 9 and on both sides of the gate electrode 10, respectively in such a manner as to be ohmic-contact therewith.

With this configuration, a distance between the gate electrode 9 and the channel layer 2 is different from a distance between the gate electrode 10 and the channel layer 2. In this way, a DFET and an EFET having specific threshold voltages $V_{th}$ different from each other can be obtained.

To accurately control a difference in threshold voltage $V_{th}$ between the DFET and EFET, it is required to accurately control a difference in depth between the recesses 9R and 10R in which the gate electrodes 9 and 10 are formed, and hence to accurately select the thickness of the threshold value control layer 4 and highly accurately control the depth of the recess 9R depending on the first etching stopping layer 5 and the depth of the recess 10R depending on the first and second etching stopping layer 5 and 7.

The DFET formed by the above method, however, is configured such that a drain current flows across the first and second etching stopping layers 5 and 7, that is, across the etching layers of the number corresponding to the number (two in this example) of the FETs having different threshold voltages, and consequently, such a DFET is disadvantageous in that a series resistance depending on the potential barriers of these etching stopping layers 5 and 7 or depending on the thicknesses and carrier concentrations of these etching stopping layers 5 and 7 may particularly degrade the on-resistance and transmission gain which are characteristic of the DFET.

Accordingly, the mixed arrangement of the EFET and DFET on the same substrate is achieved at large expense of the characteristic of one FET, the DFET in the example of the related art described above.

The semiconductor device including the FETs of the number corresponding to the desired number (two in the above example) of different threshold voltages is also disadvantageous in that since the etching stopping layers of the corresponding number (two in the example) are provided, the substrate structure is complicated and thereby the fabrication cost is raised.

To avoid such a disadvantage, it may be considered to eliminate all or at least one of the above-described two etching stopping layers; however, in this case, there occurs a problem in control of the depths of the gates of both the FETs.

The semiconductor device configured as the semiconductor integrated circuit device provided with the DFET and EFET each of which is of the modulation-doped type using a Schottky gate is further disadvantageous in reliability due to the known inconvenience of Schottky junction in which a Schottky electrode material is diffused onto the substrate side under a high temperature bias condition, to degrade the rectifying characteristic.

SUMMARY OF THE INVENTION

An object of the present invention is to provide a semiconductor device provided with at least two FETs having different threshold voltages $V_{th}$, which can be highly accurately fabricated without provision of etching stopping layers of the number corresponding to that of these FETs, with an improved reliability even if at least one of the FETs is configured as a modulation-doped FET (MODFET); and to provide a method of fabricating the semiconductor device.

To achieve the above object, according to a first aspect of the present invention, there is provided a semiconductor device including field effect transistors having different threshold voltages formed on a common base, characterized by including: a first field effect transistor having a p-n junction gate; and a second field effect transistor having a Schottky junction gate; wherein a threshold voltage of the first field effect transistor is set on the basis of a depth of the p-n junction, and a threshold voltage of the second field effect transistor is set on the basis of selection of a barrier potential of the Schottky junction.

With this configuration, one gate of at least two FETs having different threshold voltages $V_{th}$ is configured as a p-n junction gate as the impurity-doped region, and consequently, with respect to such an FET transistor, it is possible to prevent diffusion of the gate metal in a semiconductor layer.

Further, since a barrier potential of the p-n junction can be made higher than that of the Schottky junction, it is possible to further reduce the on-resistance.

According to a second aspect of the present invention, there is provided a method of fabricating a semiconductor device in which field effect transistors having different threshold voltages are formed on a common base, the method including the steps of: forming a semiconductor layer having at least a gate junction formation layer on the base; forming an insulating film on the semiconductor layer; forming a first gate formation window in the insulating film at a position where a gate formation portion of a first field effect transistor is to be formed; diffusing an impurity in the gate junction formation layer through the first gate formation window, to form a p-n junction in the gate junction formation layer; forming a second gate formation window in the insulating film at a position where a gate formation portion of a second field effect transistor is to be formed; and depositing a Schottky metal on the gate junction formation layer through the second gate formation window, to form a Schottky junction therebetween.

With this configuration, since one gate of at least two FETs is configured as a p-n junction gate, it is possible to eliminate inconvenience of the related art in which the etching stopping layer is disposed for each transistor.

DETAILED DESCRIPTION OF THE PREFERRED EMBODIMENTS

Hereinafter, embodiments of the present invention will be described with reference to the drawings.
First Embodiment In this embodiment, the present invention is applied to a semiconductor device configured as a semiconductor integrated circuit device in which an EFET and a DFET, each being of a modulation-doped type, are formed on a common substrate as FETs having different threshold voltages $V_{th}$.

The semiconductor device in this embodiment will be described with reference to FIG. 1.

Figure 1:
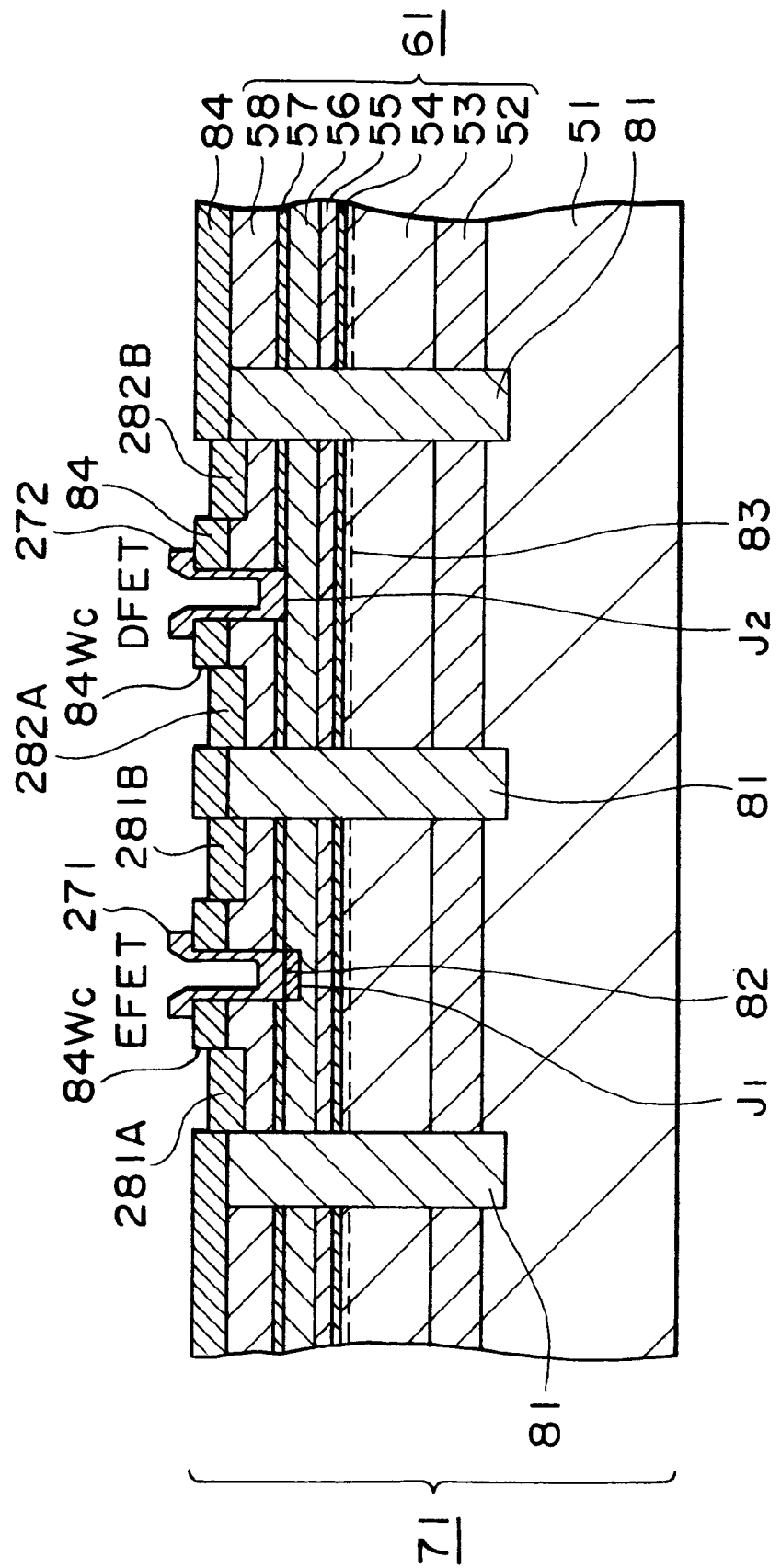
FIG. 1 is a schematic sectional view of one embodiment of a semiconductor device of the present invention.

Referring to FIG. 1, a channel layer 53 functioning as an electron migration layer, a spacer layer 54, an electron supply layer 55, a gate junction formation layer 56 of a first conduction type in which gate junction is to be formed, an etching stopping layer 57, and a cap layer 58 are sequentially formed on a base 51 made from semi-insulating GaAs via a buffer layer 52. These layers collectively constitute a semiconductor layer 61, and the base 51 and the semiconductor layer 61 formed thereon constitute a substrate 71.

An isolation region 81 for electrically isolating an EFET formation area from a DFET formation area is formed across the semiconductor layer 61. At the EFET formation area isolated by the isolation region 81, a gate region 82 of a second conduction type is formed, to form a p-n junction $J_1$ between the gate region 82 and the gate junction formation layer 56 of the first conduction type, thereby forming a first field effect transistor, an EFET in this embodiment.

At the DFET formation area isolated by the isolation region 81, a Schottky metal is deposited, to form a Schottky junction $J_2$ between the Schottky metal and the gate junction formation layer 56 of the first conduction type, thereby forming a second field effect transistor, a DFET in this embodiment.

In the above structure, threshold voltages $V_{th}$ of the first and second field effect transistors, the EFET and DFET in this embodiment are set by the depth of the p-n junction $J_1$ and the selection of the barrier potential (and further the depth) of the Schottky junction $J_2$, respectively.

A first gate electrode 271 of the first field effect transistor, that is, the EFET is formed on the gate region 82 in such a manner as to be in ohmic-contact therewith. A second gate electrode 272 of the second field effect transistor, that is, the DFET is formed by the Schottky metal.

S/D electrodes 281A and 281B are formed in the cap layer 58 on both sides of the first gate electrode 271, and S/D electrodes 282A and 282B are formed in the cap layer 58 on both sides of the second gate electrode 272.

In the semiconductor device having the above configuration, at the DFET formation area electrically isolated by the isolation region 81 on the common substrate 71, a two-dimensional electron gas layer 83 is formed at the interface between the channel layer 53 and the underside of the electron supply layer, that is, the gate junction formation layer 55; while at the EFET formation area electrically isolated by the isolation region 81 on the common substrate 71, a two-dimensional electron gas layer 83 is formed at the specific threshold voltage $V_{th}$ at the interface between the channel layer 53 and the underside of the electron supply layer, that is, the gate junction formation layer 55.

Next, one embodiment of a method of fabricating the semiconductor device of the present invention shown in FIG. 1 will be described with reference to FIGS. 2A to 2C and FIGS. 3A to 3C.

Figure 2A:
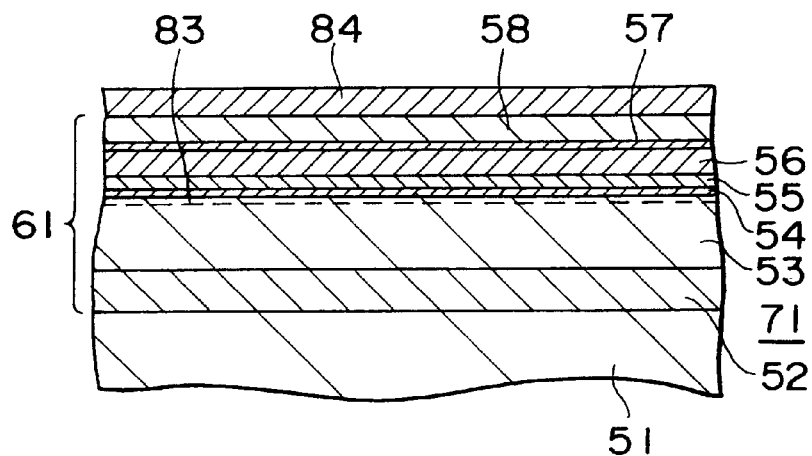
FIGS. 2A to 2C and 3A to 3C are sectional views of fragmental structures of the semiconductor device of the present invention, showing one embodiment of a method of fabricating the semiconductor devices.

Referring to FIG. 2A, a buffer layer 52, a channel layer 53 functioning as an electron migration layer, a spacer layer 54, an electron supply layer 55, a gate junction formation layer 56 of a first conduction type in which gate junction is to be formed, an etching stopping layer 57, and a cap layer 58 are sequentially formed by epitaxial growth over the entire surface of a base 51 made from semi-insulating GaAs by an MOCVD (Metalorganic Chemical Vapor Deposition) method or a MBE (Molecular Beam Epitaxy) method. These layers collectively constitute a semiconductor layer 61.

An insulating layer 84 is formed on the semiconductor layer 61.

The buffer layer 52 is configured by alternately stacking five undoped AlGaAs layers and five undoped GaAs layers, each of which has a thickness of 50 nm.

The channel layer 53 functioning as the electron migration layer is configured as an undoped GaAs layer having a thickness of 20 nm.

The spacer layer 54 is configured as an undoped AlGaAs layer having a thickness of 1–4 nm.

The electron supply layer 55 is configured as an AlGaAs layer of the first conduction type, for example, an n-type having a thickness of 5 nm. The dopant to be doped in the electron supply layer 55 is taken as Si, and the concentration of the impurity Si to be contained in the electron supply layer 55 is selected in a range of 1 to $5 \times 10^{18}$ atoms/cm$^3$ in accordance with the desired threshold voltage $V_{th}$ and two-terminal drain withstand voltage of the DFET.

The gate junction formation layer 56 is configured as a GaAs layer of the first conduction type, that is, n-type having a thickness of 80 nm. The dopant to be doped in the gate junction formation layer 56 is taken as Si, and the concentration of the impurity Si to be contained in the gate junction formation layer 56 is selected in a range of $3 \times 10^{17}$ atoms/cm$^3$ in accordance with the desired threshold voltage $V_{th}$ and two-terminal drain withstand voltage of the DFET.

The etching stopping layer 57 is configured as an AlGaAs layer of the first conduction type, that is, n-type having a thickness of 5 nm. The n-type dopant to be doped in the etching stopping layer 57 is taken as Si, and the concentration of the impurity Si to be contained in the etching stopping layer 57 is selected in a range of $5 \times 10^{17}$ atoms/cm$^3$ in accordance with the desired threshold voltage $V_{th}$ and two-terminal drain withstand voltage of the desired one of the FETS, particularly, the DFET.

The cap layer 58 is configured as a GaAs layer of the first conduction type, that is, n-type having a thickness of 30 nm. The dopant to be doped in the cap layer 58 is taken as Si, and the concentration of the impurity Si to be contained in the cap layer 58 is selected at such a value that the cap layer 58 is in contact with the S/D electrodes 281A, 281B, 282A and 282B at sufficiently low resistance, for example, at a value in a range of $5 \times 10^{18}$ atoms/cm$^3$.

The insulating layer 84 is formed by an SiN single layer film or an SiN/SiO$_2$ stacked layer film which has a thickness of 10–50 nm and which functions as a mask for diffusion of an impurity (described later).

In this way, a two-dimensional electron gas layer 83 is formed near the interface between the channel layer 53 and the underside of the electron supply layer 55 because of a difference in electron affinity therebetween.

Figure 2B:
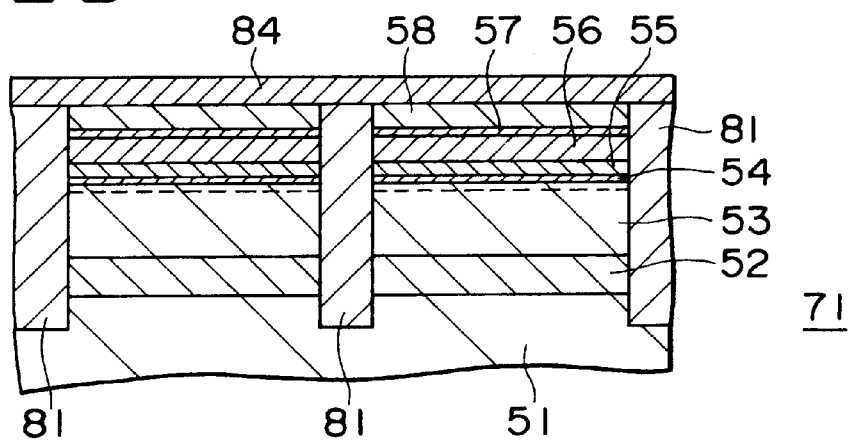

Referring to FIG. 2B, an isolation region 81 for isolating elements from each other is formed in the substrate 71 composed of the base 51 and the semiconductor layer 61 formed thereon. The isolation region 81 is formed by implanting ions of oxygen atoms via the insulating layer 84 in a grid-like plane pattern which surrounds the first and second FET formation areas (EFET and DFET formation areas in this embodiment).

In the above ion-implantation, the implantation energy is selected such that the peak of the concentration distribution is overlapped on or slightly deeper than the electron supply layer, that is, the gate junction formation layer 55, for example, selected at 150–250 keV, and the dose is selected such that the concentration of carriers in the electron supply layer become sufficiently low, for example, selected in a range of $5 \times 10^{12}$ to $1 \times 10^{13}$/cm$^2$.

Figure 2C:
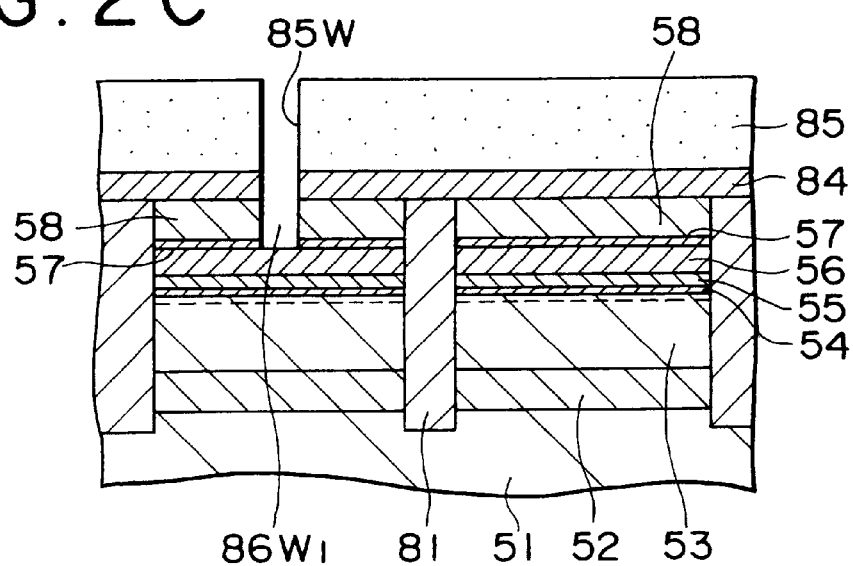

Referring to FIG. 2C, an impurity introduction window 86 is formed in the insulating layer 84 at a gate. formation portion of the EFET formation area in such a manner as to pass through the cap layer 58. The opening of the window 86 is performed by pattern-etching using photolithography.

To be more specific, the surface of the insulating layer 84 is coated with a photoresist 85; a portion, at which the window 86 is to be formed, of the photoresist 85 is removed by pattern-exposure and development, to form an opening 85w in the photoresist 85; an exposed portion of the insulating layer 84 via the opening 85W of the photoresist 85 used as an etching mask is etched and further an exposed portion of the cap layer 58 via the opening 85W is etched, to form a first gate formation window 86W$_1$.

The etching of the insulating layer 84 for forming the window 86W$_1$ is performed by reactive ion etching using a mixture gas of CF$_4$ and H$_2$ (or O$_2$), or wet etching by dipping the substrate 71 in BHF.

The etching of the cap layer 58 for forming the window 86W$_1$ is performed by reactive ion etching using a mixture gas, which generates radicals or ions of chlorine and fluorine, such as SiCl$_4$ and CF$_4$, or wet etching by dipping the substrate 71 in an etchant containing citric acid.

The etching depth of the cap layer 58 can be accurately set by making use of reduction in etching rate at the etching stopping layer 57.

Figure 3A:
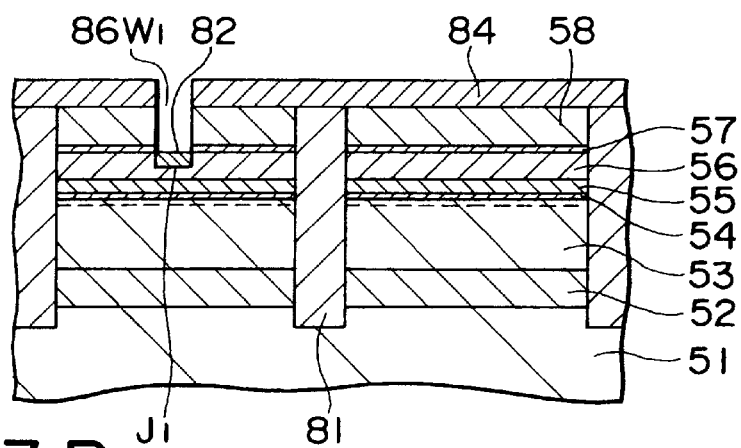

Referring to FIG. 3A, after removal of the photoresist 85 shown in FIG. 2C, impurity diffusion is performed through the first gate formation window 86W$_1$ with the insulating layer 84 taken as a mask, to form a gate region 82 having a second conduction type, that is, p-type, thereby forming a p-n junction J$_1$ between the gate region 82 and the gate junction formation layer 56.

The above impurity diffusion is performed by supplying Zn as the p-type impurity with hydrogen used as a carrier gas. In this treatment, to prevent removal of arsenic from the substrate, arsine (AsH$_3$) is added to the treatment atmosphere at a specific partial gas pressure. Concretely, the impurity is doped by supplying a mixture gas of diethyl zinc Zn(CH$_3$)$_2$, arsine AsH$_3$, and H$_2$ at a substrate temperature of 600° C.

The end point of impurity diffusion is controlled in accordance with various manners, for example, by adjusting a net diffusion time, or confirming that a pinchoff voltage reaches a specific value by a known mercury probe method.

In this embodiment, the end point of the impurity diffusion is determined such that a specific threshold voltage $V_{th}$ at the EFET can be obtained by additional impurity diffusion.

Figure 3B:
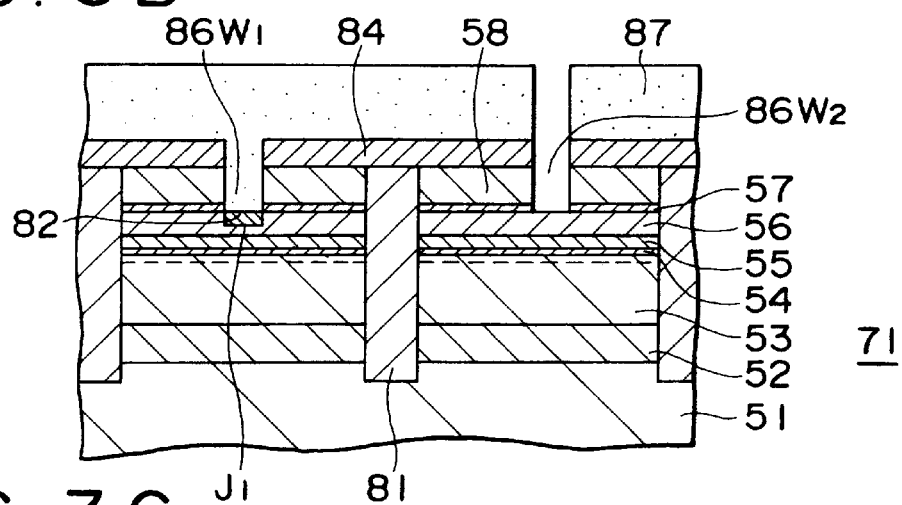

Referring to FIG. 3B, a photoresist layer 87 is formed over the entire surface in such a manner as to close the first gate formation window 86W$_1$, and a second gate formation window 86W$_2$ is formed at a gate formation portion of the second FET formation area (the DFET formation area in this embodiment) in accordance with the same manner as that for forming the first gate formation window 86W$_1$.

Figure 3C:
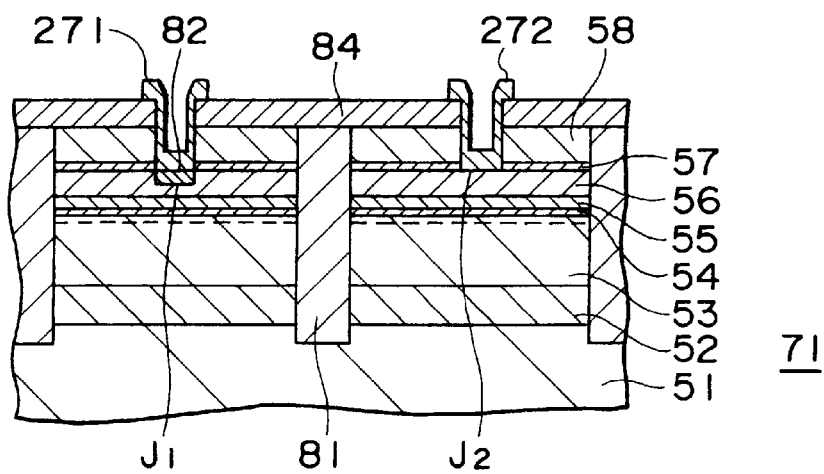

Referring to FIG. 3C, after removal of the photoresist layer 87 shown in FIG. 3B, a first gate electrode 271 is formed on the gate region 82 through the first gate formation window 86W$_1$ in such a manner as to be in ohmic-contact therewith, and a second gate electrode 272 is formed on the gate junction formation layer 56 through the second gate window 86W$_2$ in such a manner that a Schottky junction J$_2$ is formed between the second gate electrode 272 and the gate junction formation layer 56.

The first gate electrode 271 and the second gate electrode 272 for forming the Schottky junction J$_2$ can be simultaneously formed. In this case, a stacked metal film composed of a Ti layer having a thickness of 50 nm, a Pt layer having a thickness of 50 nm, and an Au layer having a thickness of 300 nm are formed, by electron beam vapor deposition, over the entire surface including the first and second gate formation windows 86W$_1$ and 86W$_2$; a photoresist layer as a mask covering the patterns of the electrodes 271 and 272 is formed by photolithography; and a portion not covered with the mask layer is removed by an ion milling method carried out by sputtering using neutral Ar beams.

Referring to FIG. 1, two contact windows 84Wc for S/D electrodes are formed in the insulating layer 84 on both sides of each of the first and second gate electrodes 271 and 272, and S/D electrodes 281A and 281B, and 282A and 282B are formed on the cap layer 58 through the contact windows 84Wc in such a manner as to be in ohmic-contact therewith.

The S/D electrodes 281A, 281B, 282A and 282B are formed by a lift-off method using a photoresist layer formed for forming the electrode contact windows. To be more specific, while not shown, the entire surface of the insulating layer 84 is coated with a photoresist; openings corresponding to the contact windows for the S/D electrodes are formed in the photoresist layer by pattern-exposure and development; and the insulating layer 84 and the cap layer 58 are subjected to reactive etching through the openings of the photoresist layer. In this case, each contact window 84Wc is formed in such a manner that even a portion of the insulating layer 84 positioned under the peripheral edge of the opening of the photoresist layer is etched by setting an etching time to be more than the usual one by about 50% or adding isotropic etching using neutral radicals or BHF. As a result, there occurs an overhang of the photoresist layer around the contact window 84Wc.

The S/D electrodes are formed by the lift-off method using the above photoresist layer. An ohmic electrode material for forming the S/D electrodes is deposited over the entire surface of the photoresist layer in such a manner as to be formed on the surface of the cap layer 58 through the electrode contact windows 84Wc; and the portion of the electrode material formed on the photoresist layer is lifted-off, together with the photoresist layer, by using an organic solvent such as acetone. In this way, the S/D electrodes 281A and 281B, and 282A and 282B are formed on the cap layer 58 through the electrode contact windows 84wc.

A two layer film composed of an AuGe alloy layer having a thickness of 170 nm and a Ni layer having a thickness of 45 nm is used as the electrode material. It may be desirable to deposit the electrode material in accordance with a method capable of suppressing an increase in substrate temperature, such as a resistance heating vapor-deposition method.

After that, the substrate 71 is heated in a forming gas atmosphere at a temperature of 400–450° C. for 30–90 sec., to alloy the S/D electrodes 281A and 281b, and 282A and 282B with the substrate material, thereby achieving the ohmic contact of the S/D electrodes.

At this time, the heat-treatment condition for alloying may be desirable that the alloying of the S/D electrodes 281A, 281B, 282A and 282B further proceeds across the etching stopping layer 57 by eliminating the etching stopping layer 57.

In the semiconductor device having the above configuration, the FETs having the different threshold voltages, the DFET and EFET in this embodiment are formed in the substrate 71 having the semiconductor layer which is formed by epitaxial growth in accordance with the manner optimized for the DFET.

In the semiconductor device and the fabrication method thereof described above, since the FETs having two different threshold voltages $V_{th}$ can be formed only by using one etching stopping layer 57, and further as described above, the etching stopping layer 57 can be finally eliminated between the S/D electrodes, it is possible to eliminate the etching stopping layer in a current path of the DFET and hence to reduce the on-resistance and improve the transmission gain and a cutoff frequency.

Since it is possible to eliminate inconvenience of the related art that the etching stopping layers of the number corresponding to that of the FETs having different threshold voltages must be formed, the configuration of the substrate 71 can be simplified and thereby the fabrication method thereof can be also simplified. This is effective to reduce the fabrication cost of the substrate 71 and to reduce the percent defective at the epitaxial step.

Since the EFET can be formed on the substrate 71 optimized for the DFET only by adding one step of forming the second gate formation window 86w$_2$ described with reference to FIGS. 3A to 3C, it is possible to simplify the steps of fabricating the semiconductor device including the EFET and DFET.

Since the gate of the EFET is configured as the p-n junction gate, it is possible to avoid the inconvenience of the semiconductor device in which the gate of the EFET is configured as the Schottky gate, that is, the degradation of the Schottky characteristic due to diffusion of the Schottky electrode material in the substrate, and hence to improve the resistance against degradation of the characteristic and to enhance the reliability.

Since the barrier potential of the p-n junction is higher than that of the Schottky junction, a higher positive gate voltage can be applied to the EFET. As a result, it is possible to obtain a large logic amplitude and a large noise margin at a DCFL logic circuit configured by the EFET and a lower on-resistance at the DFET, and hence to improve the insertion loss in the case where the device is used as an RF switch and to enhance the power efficiency in the case where the device is used as a power amplifier.

In this embodiment, the spacer layer 54 is interposed between the channel layer 53 and the electron supply layer 55 at which the two-dimensional electron gas layer 83 is formed; however, the present invention is not limited thereto but may be applied to an MODFET with no spacer layer.

Further, in this embodiment, both the EFET and DEFT as the first and second FETs having different threshold voltages $V_{th}$ formed on the common substrate 71 are configured as the MODFETs; however, according to the present invention, both the EFET and DFET can be configured as so-called doped channel FETs (hereinafter, referred to as "HFETs").

One embodiment of the semiconductor device of the present invention in which both the EFET and DFET can be configured as the HFETs will be described below.

Second Embodiment

In this embodiment, the present invention is applied to a semiconductor device in which an EFET and a DFET, each being of the HFET type, are formed on a common substrate.

The semiconductor device in this embodiment will be described with reference to FIG. 4.

In this figure, parts corresponding to those shown in FIG. 1 to FIG. 3C are designated by the same characters and the overlapped explanation thereof is omitted. Referring to FIG. 4, a buffer layer 52 configured by alternately stacking undoped AlGaAs layers and undoped GaAs layers, a channel layer 53 made from GaAs or AlGaAs of a first conduction type, for example, n-type, a gate junction formation layer 56 as a barrier layer made from undoped InGaAs having a band gap larger than that of the channel layer 53, and a cap layer 58 made from n-type heavily doped GaAs are sequentially formed by epitaxial growth on a base 51 made from semi-insulating GaAs in accordance with the same manner as that described in the first embodiment, that is, by the MOCVD or MBE method.

After that, in accordance with the same manner as that described in the first embodiment, an isolation region 81 is formed; first and second gates are formed by forming a gate region 82 and a first electrode 271 to form a p-n junction $J_1$ and forming a second gate electrode 272 to form a Schottky junction $J_2$; and S/D electrodes 281A and 281B, and 282A and 282B are formed.

Figure 4:
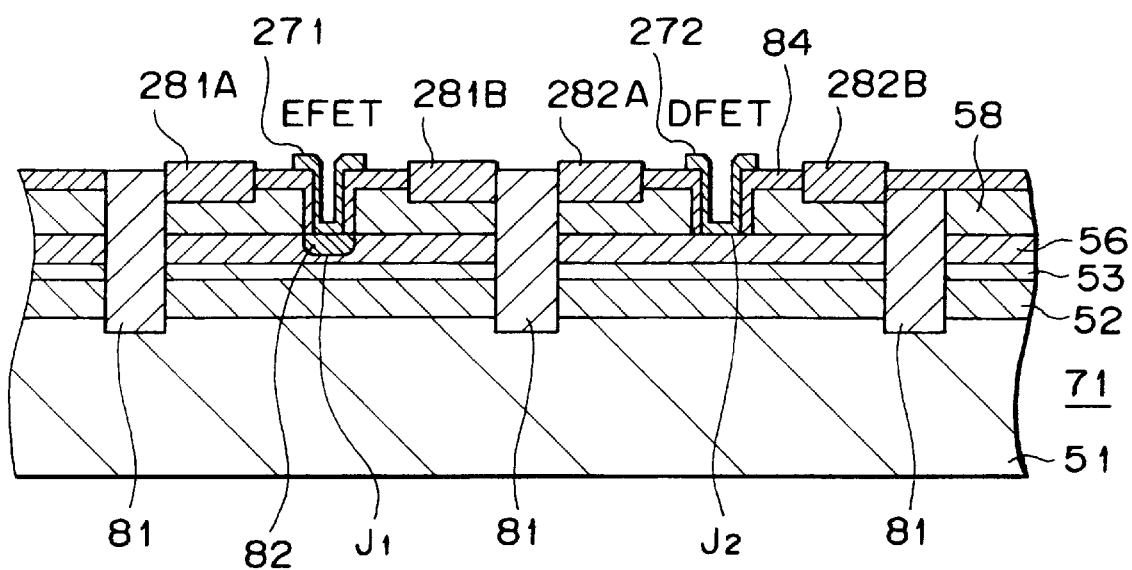
FIG. 4 is a schematic sectional view showing another embodiment of the semiconductor device of the present invention.
Figure 5:
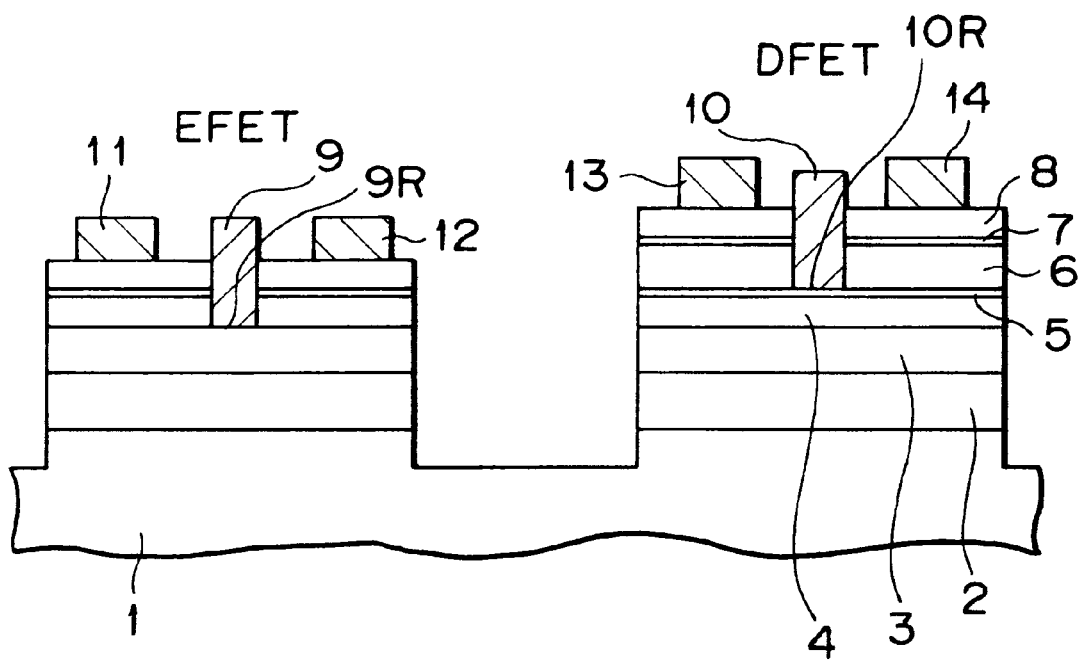
FIG. 5 is a schematic sectional view of a semiconductor device of the related art.

The formation of an etching stopping layer is omitted in the embodiment shown in FIG. 4; however, the etching stopping layer can be formed as needed.

While the preferred embodiments of the present invention have been described using the specific terms, such description is for illustrative purposes only, and it is to be understood that changes and variations may be made without departing from the spirit and scope of the following claims.

For example, in addition to the semiconductor device including the two FETs having desired different threshold voltages described in the above first and second embodiments, the present invention can be also applied to a semiconductor device including three FETs having desired different threshold voltages.

Although the first conduction type is taken as the n-type in the above embodiments, the present invention is not limited thereto. That is to say, the first conduction type may be taken as the p-type and the second conduction type be taken as the n-type. Further, the present invention can be applied not only to a semiconductor device in which FETs having different threshold voltages are formed on the common substrate 71 but also to a semiconductor integrated circuit device in which other FETs or other circuit elements are formed on the common substrate 71.

What is claimed is:

1. In a semiconductor device comprising field effect transistors having different threshold voltages formed on a common base, the improvement comprising:

a first field effect transistor having a p-n junction gate; and a second field effect transistor having a Schottky junction gate;

wherein a threshold voltage of said first field effect transistor is set on the basis of a depth of said p-n junction, and a threshold voltage of said second field effect transistor is set on the basis of selection of a barrier potential of said Schottky junction.

2. A semiconductor device according to claim 1, wherein at least one of said first and second field effect transistors is a modulation doped type field effect transistor (MODFET).

3. A semiconductor device according to claim 1, wherein at least one of said first and second field effect transistors is a doped channel field effect transistor having a doped channel layer, an undoped barrier layer, and a gate junction formation layer.

4. In a semiconductor device comprising field effect transistors having different threshold voltages formed on a common base, the improvement comprising:

a channel layer formed on said base;

an electron supply layer formed on said channel layer; and a gate junction formation layer of a first conduction type formed on said electron supply layer;

wherein a gate region of a second conduction type is formed on said gate junction formation layer, to form a first field effect transistor, and a Schottky electrode is formed on said gate junction formation layer, to form a second field effect transistor; and said first field effect transistor is electrically isolated from said second field effect transistor.

5. A semiconductor device according to claim 4, further comprising:

an etching stopping layer formed on said gate junction formation layer;

a cap layer of the first conduction type formed on said etching stopping layer, said cap layer being different in material from said etching stopping layer; and a source and a drain formed on said cap layer for each of said first and second field effect transistors.

6. A semiconductor device according to claim 5, wherein said source and drain are alloyed across said etching stopping layer.

7. A semiconductor device according to claim 4, wherein a gate region of the second conduction type is formed on said gate junction formation layer, to form a first field effect transistor having a p-n junction, and a Schottky electrode is formed on said gate junction formation layer, to form a second field effect transistor having a Schottky junction; and a barrier potential formed by said p-n junction is higher than a barrier potential formed by said Schottky junction.

8. In a semiconductor device comprising field effect transistors having different threshold voltages formed on a common base, the improvement comprising:

a channel layer formed on said base; and a gate junction formation layer formed on said channel layer, said gate junction formation layer having a band gap larger than that of said channel layer;

wherein a gate region of a second conduction type is formed on said gate junction formation layer, to form a first field effect transistor, and a Schottky electrode is formed on said gate junction formation layer, to form a second field effect transistor; and said first field effect transistor is electrically isolated from said second field effect transistor.

9. A semiconductor device according to claim 8, further comprising:

a cap layer of a first conduction type formed on said gate junction formation layer; and a source and a drain formed on said cap layer for each of said first and second field effect transistors.

10. A semiconductor device according to claim 8, wherein a gate region of a second conduction type is formed on said gate junction formation layer, to form a first field effect transistor having a p-n junction, and a Schottky electrode is formed on said gate junction formation layer, to form a second field effect transistor having a Schottky junction; and a barrier potential formed by said p-n junction is higher than a barrier potential formed by said Schottky junction.

* * * * *